United States Patent [19]

Cripe et al.

[11] Patent Number: 5,421,595
[45] Date of Patent: Jun. 6, 1995

[54] VACUUM CHUCK WITH VENTURI JET FOR CONVERTING POSITIVE PRESSURE TO A VACUUM

[75] Inventors: Jerry D. Cripe, Tempe; Joe L. Martinez, Jr., Phoenix, both of Ariz.

[73] Assignee: Motorola, Inc., Schaumburg, Ill.

[21] Appl. No.: 219,122

[22] Filed: Mar. 28, 1994

[51] Int. Cl.6 ............................................. B25B 11/00
[52] U.S. Cl. .................................. 279/3; 204/298.15; 269/21
[58] Field of Search .............. 279/3; 269/21; 451/289, 451/388; 204/298.15

[56] References Cited

U.S. PATENT DOCUMENTS 4,906,011 3/1990 Hiyamizu et al. ...................... 279/3

Primary Examiner—Steven C. Bishop
Attorney, Agent, or Firm—Robert D. Atkins

[57] ABSTRACT

A vacuum chuck (10) holds a semiconductor wafer (56) securely in place during manufacturing processes. An external chuck (12) has a hollow center portion receiving a spindle support (14) and shaft (16). A positive pressure is applied through the shaft to a nozzle assembly (26) that rests on the spindle support. The nozzle assembly is further housed within a cavity in an internal chuck (28) that rests within a cup in the external chuck. The nozzle assembly use a venturi jet (44) to convert the positive pressure to a vacuum. A plurality of vacuum ports (34 and 36) from the cavity of the internal chuck transfer the vacuum to an upper surface (40) of the internal chuck to hold the semiconductor wafer in place. A plurality of exhaust ports (30 and 32) from the cavity of the internal chuck exhaust gases radially across the upper surface (13) of the external chuck toward its perimeter to prevent undesired chemicals from reaching the underside of the semiconductor wafer.

19 Claims, 3 Drawing Sheets

VACUUM CHUCK WITH VENTURI JET FOR CONVERTING POSITIVE PRESSURE TO A VACUUM

BACKGROUND OF THE INVENTION

The present invention relates in general to semiconductor device fabrication and, more particularly, to a vacuum chuck with a venturi jet for converting a positive pressure into a vacuum that securely holds a semiconductor wafer during manufacturing processes.

A common process in semiconductor device fabrication is chemical etching where material is removed from specific areas of the semiconductor wafer by a chemical process. Areas on one surface the semiconductor wafer not intended to be etched are first masked. A liquid etchant, for example hydrochloric acid, is applied to the reactive surface of the semiconductor wafer. The etchant chemically removes material from the unmasked areas. The wafer is typically spun at a high rate to evenly distribute the etchant during the process. Etching is also used for bulk removal of material in thinning processes to achieve specific electrical characteristics.

The semiconductor wafers are commonly processed one at a time to maintain strict processing standards. One technique involves holding the semiconductor wafer in place by grasping the edges of the wafer with pins during the etching process. It is undesirable to allow the etchant to reach the bottom unreactive surface of the semiconductor wafer. A nitrogen gas is blown onto the bottom of the semiconductor wafer to remove any etchant. As the etching process proceeds, the diameter of the semiconductor wafer reduces as material at the edge etches away. The grasping of the semiconductor wafer by the edge pins becomes less secure allowing movement of the wafer and possible damage.

To solve the pin grasping problems, vacuum chucks have been used to securely hold the semiconductor wafer in place. The semiconductor wafer is positioned on the vacuum chuck and a negative pressure (vacuum) is drawn through the vacuum chuck to create a suction that secures the wafer in place. Unfortunately, the negative pressure also tends to draw liquid etchant around the edge to the bottom side of the semiconductor wafer. The liquid etchant removes semiconductor material on the bottom side of the wafer which is undesirable. Attempts have been made to block the migration of etchant from the upper surface to the bottom side of the semiconductor wafer including polymer coating and taping, but most if not all techniques involve additional processing steps and complexity that add to the overall cost of manufacture.

Hence, a need exists for an apparatus that holds the wafer securely throughout the etching process and further prevent the etchant from reaching the bottom side of the semiconductor wafer.

DETAILED DESCRIPTION OF THE PREFERRED EMBODIMENT

Figure 1:
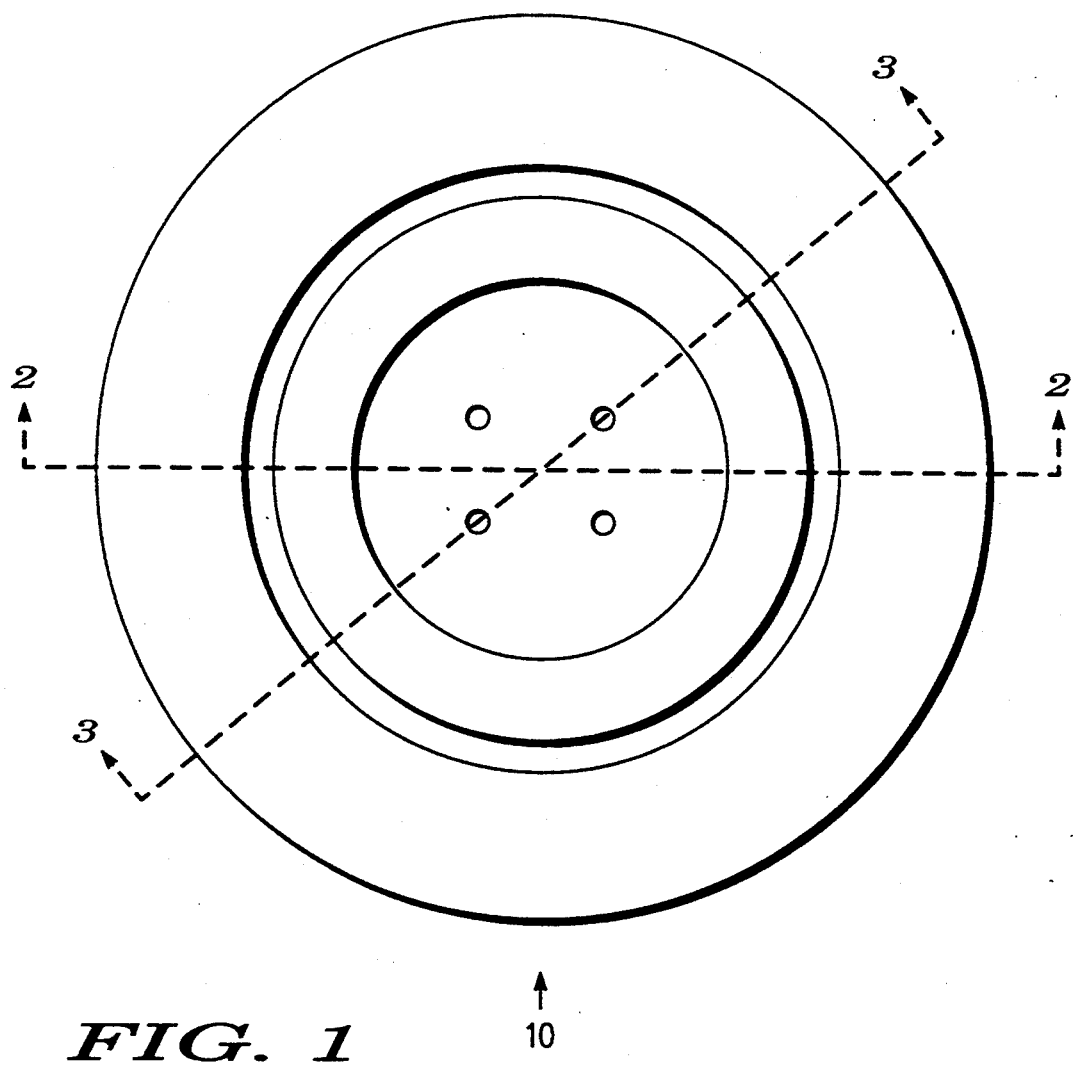
FIG. 1 illustrates a top-view of a vacuum chuck.
Figure 2:
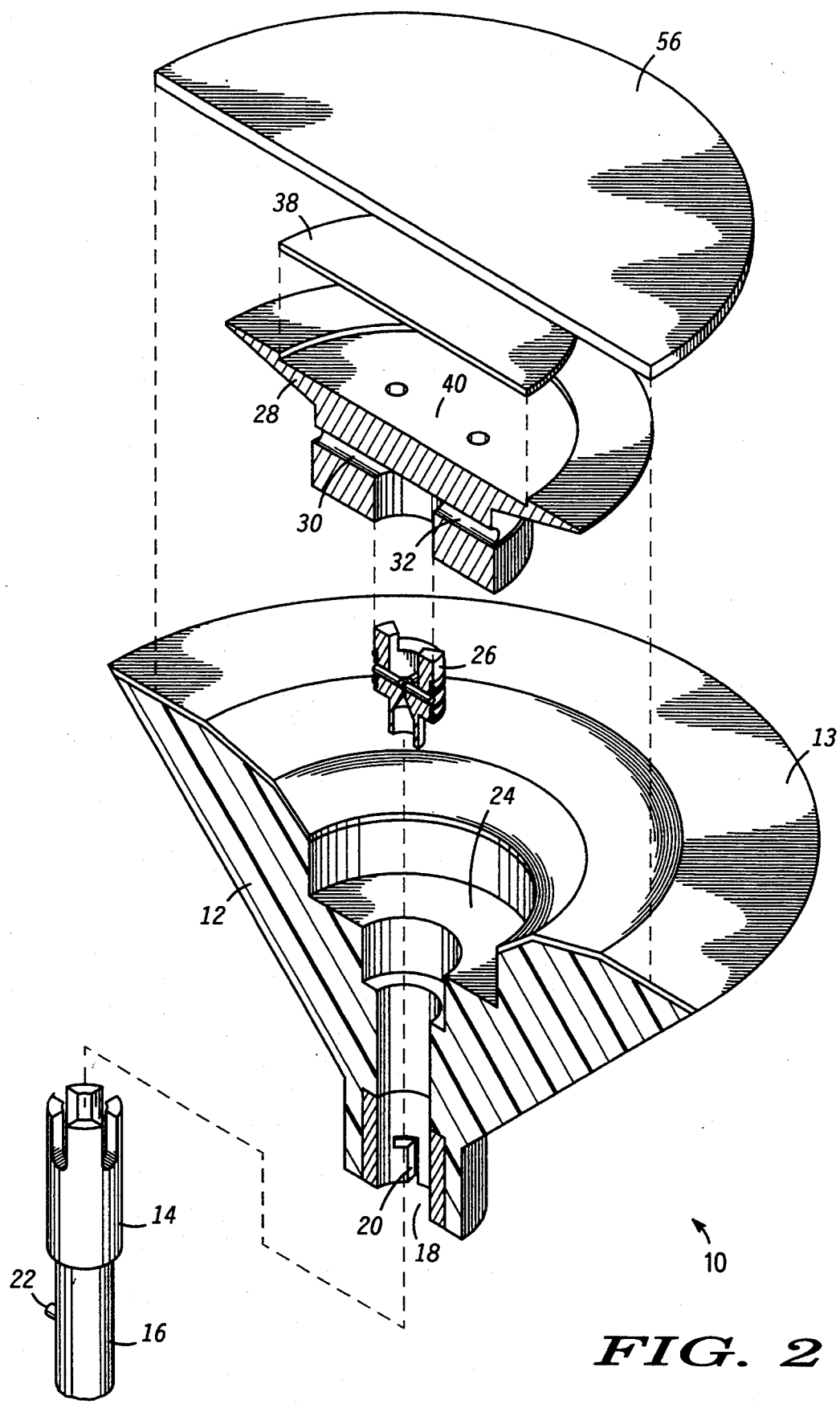
FIG. 2 illustrates a first cross-sectional view of the vacuum chuck.
Figure 3:
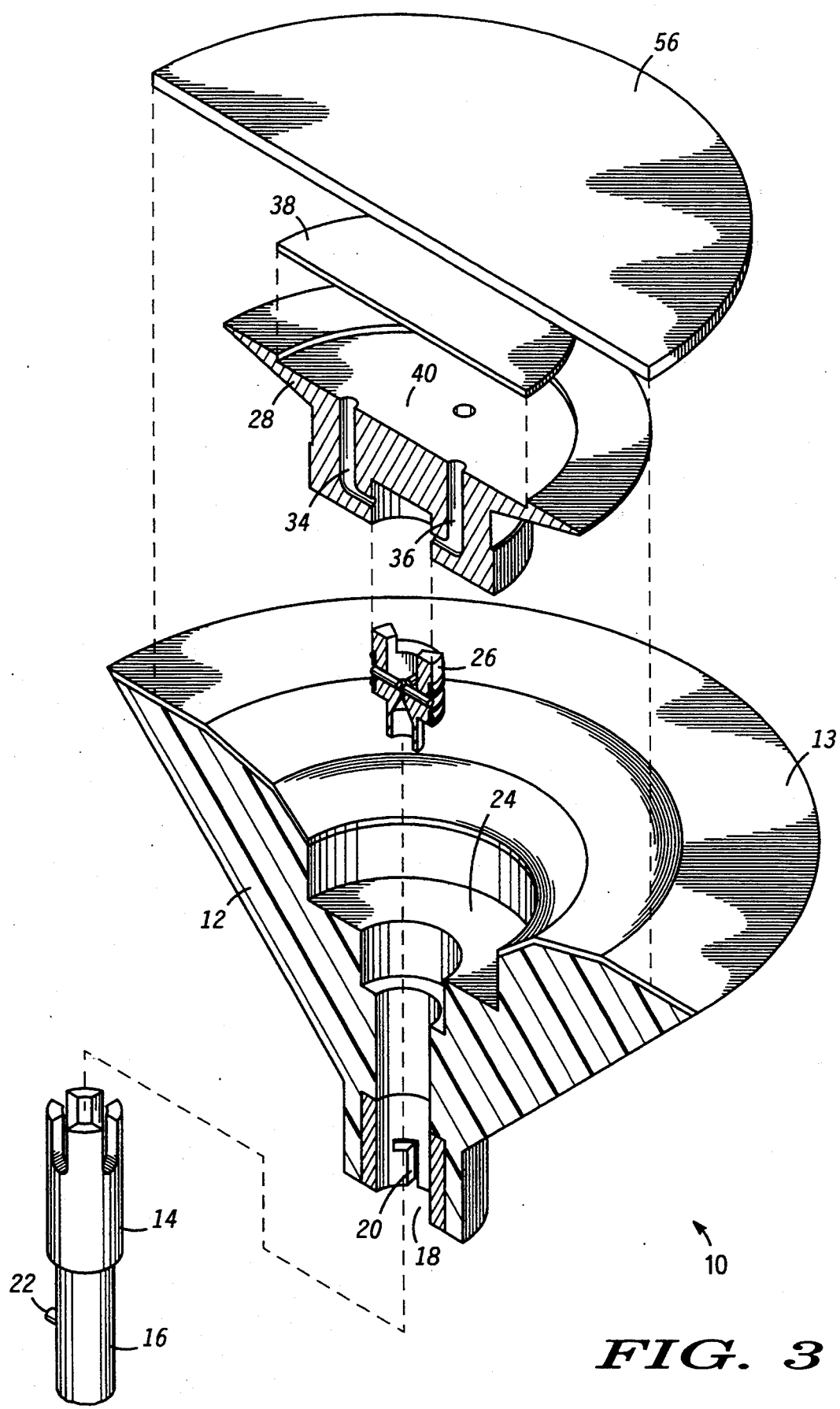
FIG. 3 illustrates a second cross-sectional view of the vacuum chuck.

Referring to FIG. 1, a top view of vacuum chuck 10 is shown with an upper surface upon which a six-inch semiconductor wafer is placed. Vacuum chuck 10 draws a vacuum on the semiconductor wafer to hold it securely in place during manufacturing processes such as chemical etching on the topside of the semiconductor wafer. The vacuum chuck also exhausts gases radially across its upper surface toward the perimeter to prevent chemical etchant from reaching the underside of the semiconductor wafer. Two cross-sectional views are illustrated in FIGS. 2 and 3 to show various ports and gas flow patterns. The dashed lines in FIG. 1 show the relative cross-sectional views of FIGS. 2 and 3.

Turning to FIG. 2, external chuck 12 is fabricated from PTFE or PVDF teflon, or metal in the shape as shown. The figures are approximately full scale. A protective cover 13 is attached to the upper surface of external chuck 12 with screws, adhesive, or other retaining mechanism. Protective cover 13 is made of polyethylene, PTFE teflon, or other polymer material compatible with the etching processes. A slotted spindle support 14 including metal shaft 16 protrudes through the hollow center portion of external chuck 12. A metal key lock 18 with slot 20 is placed in the bottom inlet of external chuck 12. Pin 22 extending radially from shaft 16 slides into slot 20 of key lock 18 to lock the spindle support assembly into the proper position such that the top of the slotted spindle support reaches approximately the level of the base of cup 24 in external chuck 12. Nozzle assembly 26 rests on top of slotted spindle support 14 with its stem extending down between the slots. The slots in spindle support 14 are deeper than the bottom stem from nozzle assembly 26 to allow purge gas to exhaust and join the purge gas exhausting from ports 30 and 32 which provides a barrier gas flow to the back side of the semiconductor wafer.

Internal chuck 28 is fabricated from PTFE or PVDF teflon, or metal in the shape as shown in FIG. 2. Internal chuck 28 includes a bottom cavity of proper size to receive nozzle assembly 26. Gas exhaust ports 30 and 32 extend from the nozzle assembly cavity radially to the cavity of cup 24. Two additional gas exhaust ports (not shown) are positioned 90 degrees with respect to exhaust ports 30 and 32. In the cross-sectional view of FIG. 3, gas vacuum ports 34 and 36 extend from the nozzle assembly cavity to upper surface 40 of internal chuck 28 as shown. Two additional gas vacuum ports (not shown) are positioned 90 degrees with respect to vacuum ports 34 and 36. A porous media insert 38 is placed on upper surface 40 of internal chuck 28 to evenly distribute the vacuum across the surface area of the porous media insert. Porous media insert 38 provides a uniform surface to support semiconductor wafer 56 while preventing contaminants from entering the vacuum chamber. Porous media insert 38 is preferably made of teflon, PVDF, polypropylene, sintered metal powders, or ceramic. Nozzle assembly 26 is inserted into the lower cavity of internal chuck 28 and the resulting assembly is placed into external chuck 12 to rest on the base of cup 24. A spacing remains between internal chuck 28 and protective cover 13 such that gas exiting from the four gas exhaust ports (e.g. ports 30 and 32) blows radially across protective cover 13 toward its perimeter.

Figure 4:
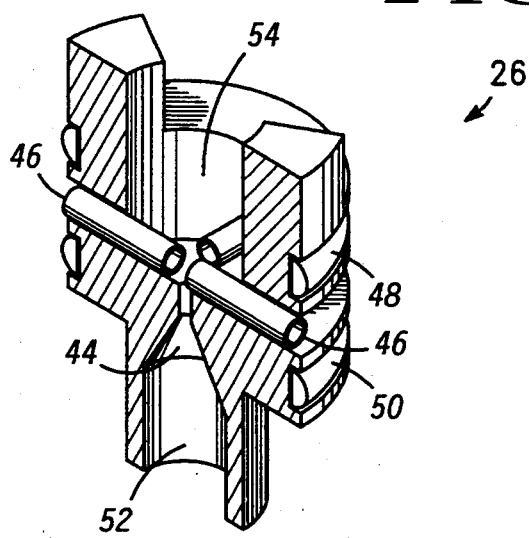
FIG. 4 illustrates further detail of the nozzle assembly in the vacuum chuck.

Nozzle assembly 26 is shown in further detail in FIG. 4 representing one feature of the present invention. The lower stem of nozzle assembly 26 houses a venturi jet 44. Four slide tubes 46 (three are shown) extend radially in 90 degree increments from the exit of the venturi jet nozzle into the cavity of cup 24. Slide tubes are positioned with one opening adjacent to the exit of the nozzle assembly to create the vacuum pressure exerted against the semiconductor wafer. Slide tubes 46 are horizontally adjustable in position relative to the exit of the nozzle assembly for regulating the vacuum pressure. O-rings 48 and 50 provide vacuum seals for slide tubes 46.

The operation and use of vacuum chuck 10 proceeds as follows. The backside of semiconductor wafer 56 is masked to isolate areas not intended for etching. Semiconductor wafer 56 is placed upside down on protective cover 13. A liquid etchant, for example hydrochloric acid, is applied to the backside (facing up) of semiconductor wafer 56. In order to ensure uniformity of etchant across the reactive surface to semiconductor wafer 56, vacuum chuck 10 rotates at say 3000 revolutions per minute.

Vacuum chuck 10 draws a vacuum on the center region of semiconductor wafer 56 above porous media insert 38 to hold it securely in place. A gas that is inert to semiconductor wafer 56 and the chemical etching processes, for example nitrogen, is forced upward through shaft 16 at three to eighty PSIG into gas entrance chamber 52 of FIG. 4. The gas creates a positive pressure in shaft 16 and chamber 52. Venturi jet 44 reduces the surface area of chamber 52 and increases the gas velocity as it flows through the jet nozzle into gas exit chamber 54. The high velocity gas flowing adjacent to one open end of slide tubes 46 creates a negative pressure and draws gas from surface 40 through the vacuum ports into the nozzle assembly cavity of internal chuck 28, which is sealed by O-rings 48 and 50. The gas flow continues into slide tubes 46 to the low pressure nozzle of venturi jet 44 and out gas exit chamber 54. The pressure drop at the exit of venturi jet 44 is a function of its orifice size and the positive pressure of gas flowing up through shaft 16 feeding entrance chamber 52. The pressure changes according to the conservation of mechanical energy through conversion of fluid velocity to pressure, neglecting friction, expansion, and turbulence effects. The pressure change is negative, i.e. a vacuum, and proportional to the square of the flow rate.

The gas drawn from the nozzle assembly cavity creates a vacuum that is transferred through gas vacuum ports 34 and 36 to upper surface 40 of internal chuck 28 where it is evenly distributed by porous media insert 38 across the center region of semiconductor wafer 56. Porous media insert 38 also provides a uniform surface for semiconductor wafer 56 to rest upon which prevents distortion or deflection of the wafer under the force of the vacuum. Porous media insert 38 further prevents contaminants from entering the vacuum chamber. The vacuum acts on the center region of semiconductor wafer 56 and holds it securely in place during the etchant spinning without causing damage to any part of the semiconductor wafer.

The combination of the gas flowing into venturi jet 44 and the gas drawn through slide tubes 46 to create the vacuum exits from chamber 54 and flows through the four gas exhaust ports (e.g. ports 30 and 32) into cup 24. The gas flows through the spacing between external chuck 12 and internal chuck 28 and exits vacuum chuck 10 at the top surface perimeter of internal chuck 28. The gas continues radially along the upper surface of external chuck 12 between protective cover 13 and semiconductor wafer 56. The positive pressure exerted by the exhausting gas serves to form a gas barrier around the perimeter of vacuum chuck 10 and keeps the liquid etchant on the top surface of semiconductor wafer 56 from migrating to and chemically reacting with the underside of semiconductor wafer 56.

By now it should be appreciated that the vacuum chuck uses a venturi jet to convert a positive pressure to a vacuum. The vacuum is transferred by ports to the center region of the semiconductor wafer holds it securely in place during manufacturing processes. The vacuum chuck also exhausts gases radially across its upper surface toward its perimeter to create a gas barrier and prevent undesired chemicals from reaching the underside of the semiconductor wafer.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. An apparatus for holding a semiconductor wafer in place, comprising:
    a first assembly coupled for receiving a gas flow;
    a nozzle assembly having an inlet for receiving said gas flow to create a vacuum at an exit of said nozzle assembly; and
    a second assembly placed within a cup of said first assembly, said second assembly including a cavity for housing said nozzle assembly and further including a gas vacuum port routed from said exit of said nozzle assembly to an upper surface of said second assembly to draw said vacuum on the semiconductor wafer.

2. The apparatus of claim 1 wherein said second assembly further includes a gas exhaust port from said cavity of said second assembly for exhausting said gas flow from said nozzle assembly between said first and second assemblies and along an upper surface of said first assembly to create a positive pressure at a perimeter of said first assembly.

3. The apparatus of claim 2 wherein said second assembly further includes a porous media insert placed said upper surface of said second assembly to evenly distribute said vacuum on a center region of the semiconductor wafer and to support the semiconductor wafer.

4. The apparatus of claim 3 wherein said first assembly includes a spindle support and shaft protruding through a hollow center portion of said first assembly for supporting said nozzle assembly.

5. The apparatus of claim 4 wherein said first assembly includes a key lock positioned around said hollow center portion of said first assembly for locking said spindle support and shaft into a predetermined position.

6. The apparatus of claim 1 wherein said nozzle assembly includes a venturi jet for increasing velocity of said gas flow.

7. The apparatus of claim 6 wherein said nozzle assembly includes first and second slide tubes positioned with one opening adjacent to said exit of said nozzle assembly for creating said vacuum.

8. The apparatus of claim 7 wherein said first and second slide tubes are adjustable in position adjacent to said exit of said nozzle assembly for regulating said vacuum.

9. A method of holding a semiconductor wafer in place, comprising the steps of:
channeling a first gas flow through a nozzle to create a vacuum at an exit of said nozzle;
drawing a second gas flow from an upper surface of an assembly to said exit of said nozzle to transfer said vacuum to said upper surface of said assembly; and
exhausting said first and second gas flows along said upper surface of said assembly to create a positive pressure at a perimeter of said assembly.

10. The method of claim 9 further including the step of distributing said vacuum evenly about a center region on the semiconductor wafer.

11. The method of claim 10 further including the step of increasing velocity of said first gas flow to draw said second gas flow.

12. The method of claim 11 further including the step of adjusting said second gas flow to regulate said vacuum.

13. An apparatus for holding a semiconductor wafer in place, comprising:
a first assembly coupled for receiving a gas flow;
a nozzle assembly having an inlet for receiving said gas flow to create a vacuum at an exit of said nozzle assembly; and
a second assembly placed within a cup of said first assembly, said second assembly including a cavity for housing said nozzle assembly and further including a gas vacuum port routed from said exit of said nozzle assembly to an upper surface of said second assembly to draw said vacuum on the semiconductor wafer, said second assembly further including a gas exhaust port from said cavity of said second assembly for exhausting said gas flow from said nozzle assembly between said first and second assemblies and along an upper surface of said first assembly to create a positive pressure at a perimeter of said first assembly.

14. The apparatus of claim 13 wherein said second assembly further includes a porous media insert placed said upper surface of said second assembly to evenly distribute said vacuum on the semiconductor wafer.

15. The apparatus of claim 14 wherein said first assembly includes a spindle support and shaft protruding through a hollow center portion of said first assembly for supporting said nozzle assembly.

16. The apparatus of claim 15 wherein said first assembly includes a key lock positioned around said hollow center portion of said first assembly for locking said spindle support and shaft into a predetermined position.

17. The apparatus of claim 13 wherein said nozzle assembly includes a venturi jet for increasing velocity of said gas flow.

18. The apparatus of claim 17 wherein said nozzle assembly includes first and second slide tubes positioned with one opening adjacent to said exit of said nozzle assembly for creating said vacuum.

19. The apparatus of claim 18 wherein said first and second slide tubes are adjustable in position adjacent to said exit of said nozzle assembly for regulating said vacuum.

* * * * *